(12) United States Patent
Azadet et al.

(10) Patent No.: US 7,577,225 B2
(45) Date of Patent: Aug. 18, 2009

(54) DIGITAL PHASE-LOOKED LOOP

(75) Inventors: Kameran Azadet, Morganville, NJ (US); Fuji Yang, Holmdel, NJ (US)

(73) Assignee: Agere Systems Inc., Allentown, PA (US)

(*) Notice: Subject to any disclaimer, the term of this patent is extended or adjusted under 35 U.S.C. 154(b) by 603 days.

(21) Appl. No.: 11/191,895

(22) Filed: Jul. 28, 2005

(65) Prior Publication Data

US 2007/0025490 A1 Feb. 1, 2007

(51) Int. Cl.
*H03D 3/24* (2006.01)
(52) U.S. Cl. .................... 375/373; 375/371; 375/375; 375/376; 455/260; 327/156; 327/159; 327/147; 327/150
(58) Field of Classification Search .................. None
See application file for complete search history.

(56) References Cited

U.S. PATENT DOCUMENTS

| | | | | |
|---|---|---|---|---|
| 4,987,373 A * | 1/1991 | Soo | ............................. | 327/145 |
| 5,018,169 A * | 5/1991 | Wong et al. | .................. | 375/373 |
| 5,511,100 A * | 4/1996 | Lundberg et al. | ........... | 375/376 |
| 5,727,038 A * | 3/1998 | May et al. | .................... | 375/376 |
| 6,348,823 B1 * | 2/2002 | Pan | ............................. | 327/159 |
| 6,441,667 B1 * | 8/2002 | Boerstler et al. | ............ | 327/295 |
| 6,442,225 B1 * | 8/2002 | Huang | ........................ | 375/376 |
| 6,640,194 B2 * | 10/2003 | Little et al. | ................... | 702/74 |
| 6,690,240 B2 * | 2/2004 | Maxim et al. | ................. | 331/17 |
| 7,295,077 B2 * | 11/2007 | Thomsen et al. | .............. | 331/10 |
| 2003/0198311 A1 * | 10/2003 | Song et al. | .................. | 375/376 |
| 2005/0258908 A1 * | 11/2005 | Mitric | .......................... | 331/16 |
| 2006/0171495 A1 * | 8/2006 | Youssouflan | ................. | 375/376 |
| 2007/0071156 A1 * | 3/2007 | Gregorius et al. | ........... | 375/376 |
| 2007/0104292 A1 * | 5/2007 | Gregorius | .................... | 375/327 |
| 2007/0200638 A1 * | 8/2007 | Sandner et al. | ............... | 331/16 |
| 2008/0074201 A1 * | 3/2008 | Henzler et al. | ................ | 331/17 |
| 2008/0130816 A1 * | 6/2008 | Martin et al. | ............... | 375/373 |
| 2009/0096535 A1 * | 4/2009 | Chang | .......................... | 331/17 |
| 2009/0129525 A1 * | 5/2009 | Oh | .............................. | 375/376 |

OTHER PUBLICATIONS

Choi, Youngdon et al.; "Jitter Transfer Analysis of Tracked Oversampling Techniques for Multigigabit Clock and Data Recovery"; Manuscript Paper; IEEE Transactions on Circuits and Systems-II: Analog and Digital Signal Processing; vol. 50, No. 11, Nov. 2003; USA.

(Continued)

*Primary Examiner*—Shuwang Liu
*Assistant Examiner*—Gina Mckie (57) ABSTRACT

Embodiments of the invention include an integrated circuit including a phase-locked loop (PLL). The integrated circuit includes a phase detector, a frequency detector, a loop filter, a digitally-controlled oscillator and a corresponding plurality of frequency dividers. The phase detector generates a first binary output based on a phase comparison of a reference clock signal to a plurality of clock phase inputs. The frequency detector generates a second binary output based on a frequency comparison of the reference clock signal to the clock phase inputs. The loop filter generates a third binary output based on the first binary output and the second binary output. The DCO feeds back the clock phase inputs, via the frequency dividers, to the phase detector based on the third binary output, and feeds back one of the clock phases to the frequency detector based on the third binary output.

10 Claims, 6 Drawing Sheets

OTHER PUBLICATIONS

Olsson, Thomas et al.; "A Digitally Controlled PLL for SOC Applications"; Manuscript Paper, IEEE Journal of Solid-State Circuits; vol. 39, No. 5; May 2004; USA.

Kajiwara, Akihiro et al.; "A New PLL Frequency Synthesizer with High Switching Speed"; Manuscript Paper, IEEE Transactions on Vehicular Technology; vol. 41, No. 4; Nov. 1992; USA.

* cited by examiner

DIGITAL PHASE-LOOKED LOOP

BACKGROUND OF THE INVENTION

1. Field of the Invention

The invention relates to phase-locked loop (PLL) circuits. More particularly, the invention relates to sampling phase detectors in all digital phase-locked loops.

2. Description of the Related Art

A phase-locked loop (PLL) is a circuit that generates a periodic output signal, or clock, that has a constant phase relationship with a periodic input signal. PLLs are closed loop frequency control systems whose operation depends on the detection of the phase difference between the input and output signals of the circuit, and are used in many types of measurement, microprocessor and communications applications.

Typically, a conventional PLL includes a phase/frequency detector (PFD), a charge pump, a loop filter, a voltage-controlled oscillator (VCO) to generate the PLL output clock, and a frequency divider. The PFD measures the difference in phase between an input clock and a feedback clock, which may be the PLL output clock itself, or a clock generated by passing the PLL output clock through the frequency divider, and generates an error signal that is proportional to the measured phase difference. The charge pump generates an amount of charge that is proportional to the error signal and inputs the charge to the loop filter. The loop filter outputs a VCO control voltage that is supplied to the VCO. The frequency of the PLL output clock generated by the VCO is controlled by the loop filter (VCO control) voltage supplied to the VCO.

Loop filters in conventional PLLs typically are analog loop filters that use passive components, such as capacitors and resistors. However, such components in these analog loop filters require a relatively large amount of chip area on an integrated circuit containing the PLL. The use of a digital loop filter and a completely digital PLL greatly reduces the chip area needed for the PLL.

The article "A Digitally Controlled PLL for SoC Applications," IEEE Journal of Solid-State Circuits, Vol. 39, No. 5, May 2004, describes the design and fabrication of a fully integrated digitally controlled phase-locked loop (PLL) used as a clock multiplying circuit. The phase detector in this PLL is based on a time to digital converter, which is realized through the use of several counters. Although the digitally controlled PLL described in the article occupies an area of only approximately 0.07 mm$^2$, its design is relatively complex compared to many conventional digital PLL designs.

Accordingly, it would be desirable to have available an all digital PLL that occupies less chip area than conventional PLLs that include analog components, and whose design is less complex than conventional digital PLLs.

SUMMARY OF THE INVENTION

The invention is embodied in an integrated circuit including a phase-locked loop (PLL). The integrated circuit includes a phase detector, a frequency detector, a loop filter and a digitally-controlled oscillator (DCO). The phase detector generates a first binary output based on a comparison of the phase of a reference clock signal to the phase of a plurality of clock phase inputs. The frequency detector generates a second binary output based on a comparison of the frequency of the reference clock signal to the frequency of the clock phase inputs. The loop filter, which is coupled to the phase detector and the frequency detector, generates a third binary output based on the first binary output from the phase detector and the second binary output from the frequency detector. The DCO, which is coupled to the loop filter, the phase detector and the frequency detector, outputs the plurality of clock phase inputs to the phase detector, via a first feedback path, based on the third binary output. Also, the DCO provides one of the number of phases in the plurality of clock phase inputs to the frequency detector, via a second feedback path, based on the third binary output. The invention also includes a method for phase locking a digitally-controlled oscillator (DCO) to a reference clock. The method includes generating a first multi-bit control word representing a phase difference between the reference clock signal and the plurality of clock phase inputs, generating a second multi-bit control word representing a frequency difference between the reference clock signal and the plurality of clock phase inputs, generating a third multi-bit (operating) control word representing a summation of the first multi-bit control word and the second multi-bit control word, providing the plurality of clock phase inputs to the phase detector via a first feedback path based on the third control word, and providing at least one of the number of phases in the plurality of clock phase inputs to the frequency detector via a second feedback path based on the third control word.

BRIEF DESCRIPTION OF THE DRAWINGS

FIG. 3b is a simplified graphic diagram of the multi-phase outputs from the digitally-controlled oscillator of FIG. 3a;

FIG. 4b is a simplified graphic diagram of the inputs to and the outputs from the phase detector of FIG. 4a;

DETAILED DESCRIPTION OF EXEMPLARY EMBODIMENTS

In the following description, like reference numerals indicate like components to enhance the understanding of the invention through the description of the drawings. Also, although specific features, configurations and arrangements are discussed hereinbelow, it should be understood that such is done for illustrative purposes only. A person skilled in the relevant art will recognize that other steps, configurations and arrangements are useful without departing from the spirit and scope of the invention.

Figure 1:
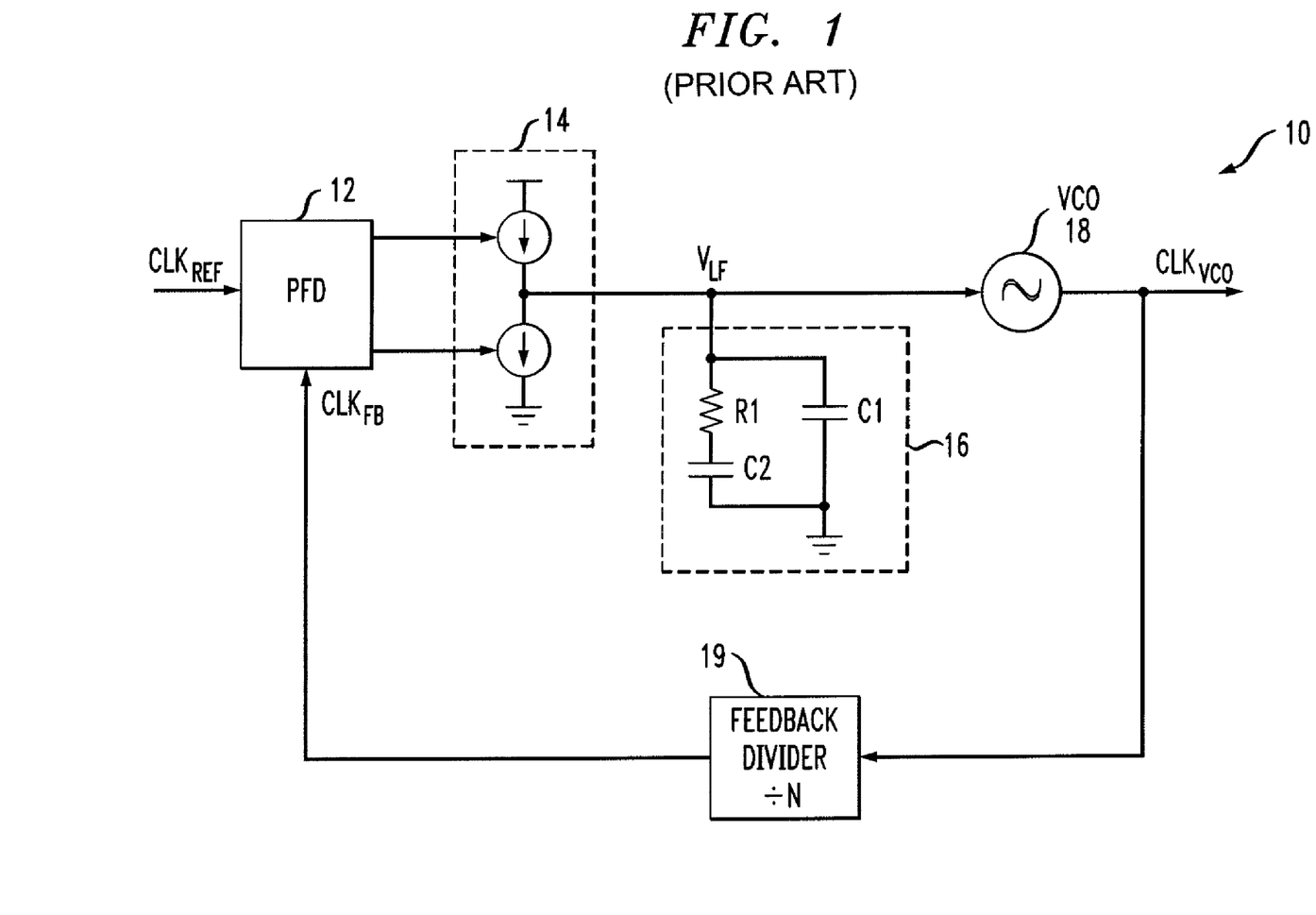
FIG. 1 is a simplified schematic diagram of a conventional phase-locked loop (PLL)

Referring now to FIG. 1, shown is a simplified schematic diagram of a conventional phase-locked loop (PLL) 10. As discussed previously herein, a PLL is a circuit that generates a periodic output signal, or clock, that has a constant phase and frequency relationship with respect to a periodic input signal. The PLL 10 includes a phase/frequency detector (PFD) 12, a charge pump (shown as 14), a loop filter (shown as 16), a voltage-controlled oscillator (VCO) 18, and a feedback frequency divider 19.

The PFD 12 compares the phase of an input signal or reference clock signal, $CLK_{REF}$, to the phase of a feedback signal, $CLK_{FB}$, and generates a pulse-width modulated error signal, UP or DOWN, which has a pulse width that is indicative of the phase difference between the two signals. The error signal is UP when the phase ($\theta_{IN}$) of the input signal leads the phase ($\theta_{FB}$) of the feedback signal and DOWN when the phase $\theta_{IN}$ lags the phase $\theta_{FB}$. Furthermore, the pulse width of the error signal is proportional to the phase difference, $\theta_{IN} - \theta_{FB}$.

The charge pump 14, which typically is embodied in two switched current sources connected generally as shown, generates an amount of charge proportional to the error signal and inputs this charge to the loop filter 16. The loop filter 16 typically is embodied in a series combination resistor, $R_1$, and capacitor, $C_2$, in parallel with a capacitor $C_1$, as shown. Other more complex loop filter configurations are possible, however, this configuration is widely used in conventional charge pump PLLs. As discussed previously herein, the loop filter 16 typically is an analog loop filter with passive components, such as resistor $R_1$ and capacitors $C_1$ and $C_2$. The loop filter 16 accumulates the net charge from the charge pump 14 and generates a loop filter voltage, $V_{LF}$.

The voltage from the loop filter 16, $V_{LF}$, is input to the VCO 18 as a control voltage that biases the VCO 18. The VCO 18 generates a periodic output or operating signal, $CLK_{VCO}$, which is the output of PLL 10. The frequency, $F_{VCO}$, of the operating signal, $CLK_{VCO}$, is a function of the loop filter voltage, $V_{LF}$.

The VCO output signal, $CLK_{VCO}$, is used to generate the feedback signal, $CLK_{FB}$, to the PFD 12. The feedback signal may be generated using an optional frequency divider circuit (shown generally as 19), having a divisor N. In this case, the frequency, $F_{FB}$, of the feedback signal, $CLK_{FB}$, is equal to the operating signal frequency, $F_{VCO}$, divided by the divisor N. That is, $F_{FB} = F_{VCO}/N$. Similarly, an additional divider circuit (not shown) may be used to divide the frequency, $F_{IN}$, of the input or reference clock signal, $CLK_{REF}$.

The feedback path between the VCO 18 and the PFD 12 adjusts the frequency and phase of the clock output from the PLL 10 ($CLK_{VCO}$) such that, when the PLL 10 is locked, the frequency and phase of the feedback clock are equal to the frequency and phase of the input signal, i.e., $F_{FB} = F_{IN}$ and $\theta_{FB} = \theta_{IN}$. Thus, when the PLL 10 is locked, the loop filter voltage, $V_{LF}$, is such that the frequency of the PLL output clock is equal to $F_{VCO} = N \times F_{IN}$.

As discussed previously herein, conventional PLLs require relatively large chip areas due to the analog loop filter and its passive components, such as the loop filter resistor $R_1$ and the loop filter capacitors $C_1$ and $C_2$. Also, the performance of the PLL is limited somewhat by relatively large current leakage from capacitors manufactured by advanced sub-micron metal oxide semiconductor (MOS) fabrication processes. Furthermore, conventional analog PLLs are process dependent, and thus often require relatively significant re-design efforts when migrating from one process to another. Conventional attempts to resolve these issues by designing an all digital PLL generally have resulted in relatively complex PLL designs.

According to embodiments of the invention, an all digital PLL is disclosed that uses an inventive digital phase detector, whose output is in the form of binary bits corresponding to an error voltage rather than the error voltage output by conventional phase detectors. In this manner, a conventional charge pump no longer is needed and the use of a digital loop filter is made possible. PLLs according to embodiments of the invention have a relatively small chip area and operate with a relatively low supply voltage. Also, the operating performance of PLLs according to embodiments of the invention is more robust against environmental noise than conventional PLLs.

Figure 2:
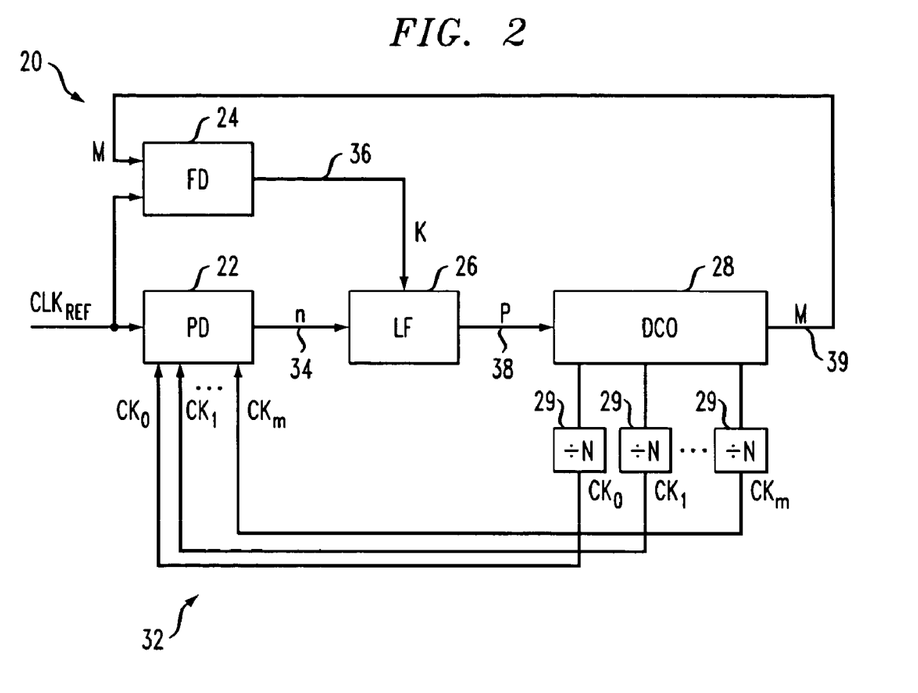
FIG. 2 is a simplified schematic diagram of a digital phase-locked loop according to embodiments of the invention.

Referring now to FIG. 2, shown is a simplified schematic diagram of a phase-locked loop (PLL) 20 according to embodiments of the invention. The PLL 20 includes a phase detector 22, a frequency detector 24, a loop filter 26, an oscillator 28 and a number (M) of frequency dividers 29, which divide the output frequency of the oscillator 28 by a divisor N. As will be described in greater detail hereinbelow, according to embodiments of the invention, all of the major components of the PLL 20 are digital. That is, the phase detector 22 is a digital phase detector whose output is a binary or binary-coded control word or set of bits, thus allowing a digital loop filter to be used. The loop filter 26 is a digital loop filter that replaces the conventional analog loop filter and its passive components. The frequency dividers 29 also are digitally implemented. According to embodiments of the invention, there is no charge pump. Also, the oscillator 28 is a digitally-controlled oscillator (DCO), such as a multi-phase ring oscillator.

According to embodiments of the invention, the PLL 20 is comprised of any suitable structure or arrangement, e.g., one or more integrated circuits. Alternatively, one or more of the components comprising the PLL 20 is comprised of any suitable structure or arrangement, e.g., one or more integrated circuits. Also, alternatively, one or more of the elements comprising any one or more of the components comprising the PLL 20 is comprised of any suitable structure or arrangement, e.g., one or more integrated circuits.

As shown in FIG. 2, the PLL 20 has an input signal or reference clock signal, $CLK_{REF}$, that inputs to the phase detector 22 and to a first input of the frequency detector 24. The phase detector 22 also has a plurality of clock phase inputs 32, e.g., samplers or sampler inputs $Ck_0$, $Ck_1$, $Ck_2$, ..., $Ck_m$. Compared to conventional PLLs, the plurality of sampler inputs 32 collectively represent the feedback loop between the oscillator and the phase detector. As will be discussed in greater detail hereinbelow, the plurality of sampler inputs 32 are a frequency-divided version of a plurality of multi-phase outputs (e.g., m multi-phase outputs) from the DCO 28. The phase detector 22 has an output line 34 that inputs to a first input of the loop filter 26. As will be discussed in greater detail hereinbelow, the phase detector 22 generates an n-bit binary or binary-coded control word to the first input of the loop filter 26 via the output line 34.

The frequency detector 24 has an output line 36 that inputs to a second input of the loop filter 26. As will be discussed in greater detail hereinbelow, the frequency detector 24 generates a k-bit binary or binary-coded control word to the second input of the loop filter 26 via the output line 36. The loop filter 26 has an output line 38 that inputs to the DCO 28. As will be discussed in greater detail hereinbelow, the loop filter 26 generates a p-bit binary or binary-coded control word to the input of the DCO 28 via the output line 38. The plurality of multi-phase outputs from the DCO 28 are scaled down or divided down via the frequency dividers 29 and coupled or input to the phase detector 22 as the sampler inputs $Ck_0$, $Ck_1$, $Ck_2$, ..., $Ck_m$. The DCO 28 has another output line 39 that inputs to a second input of the frequency detector 24.

Figure 3A:
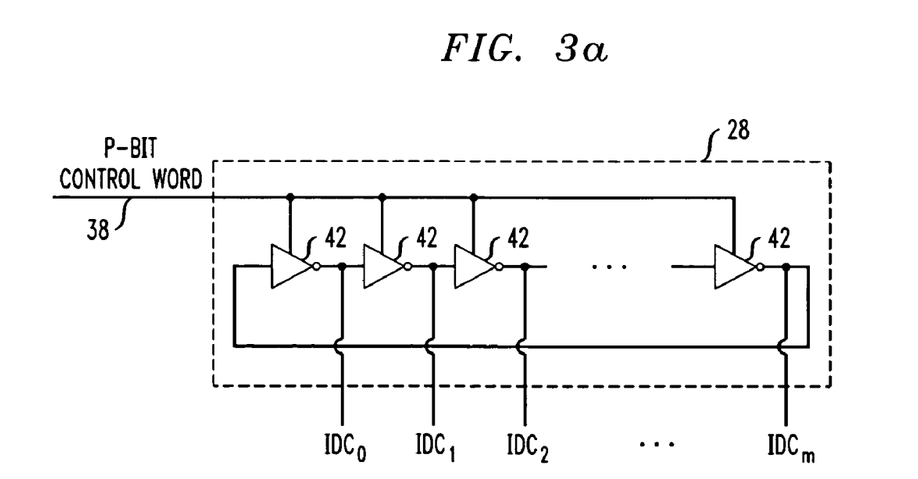
FIG. 3a is a simplified schematic diagram of a multi-phase ring oscillator portion of a digitally-controlled oscillator (DCO) according to an embodiment of the invention.

Referring now to FIG. 3a, shown is a suitable configuration for the DCO 28, according to an embodiment of the invention. It should be understood that the DCO 28 can have other suitable configurations. In this particular configuration, the DCO 28 includes a multi-phase ring oscillator having a plurality of delay cells 42, e.g., m delay cells, coupled together as shown. In this particular configuration, m is an odd number, however for other configurations, m can be an even number. The delay cells 42 have an additional input line to which the output line 38 of the loop filter 26 is coupled, as shown. This additional input line controls the delay of the particular inverted delay cell. As discussed hereinabove, the loop filter 26 generates a p-bit control word, which is output the DCO 28 via the output line 38.

Figure 3B:
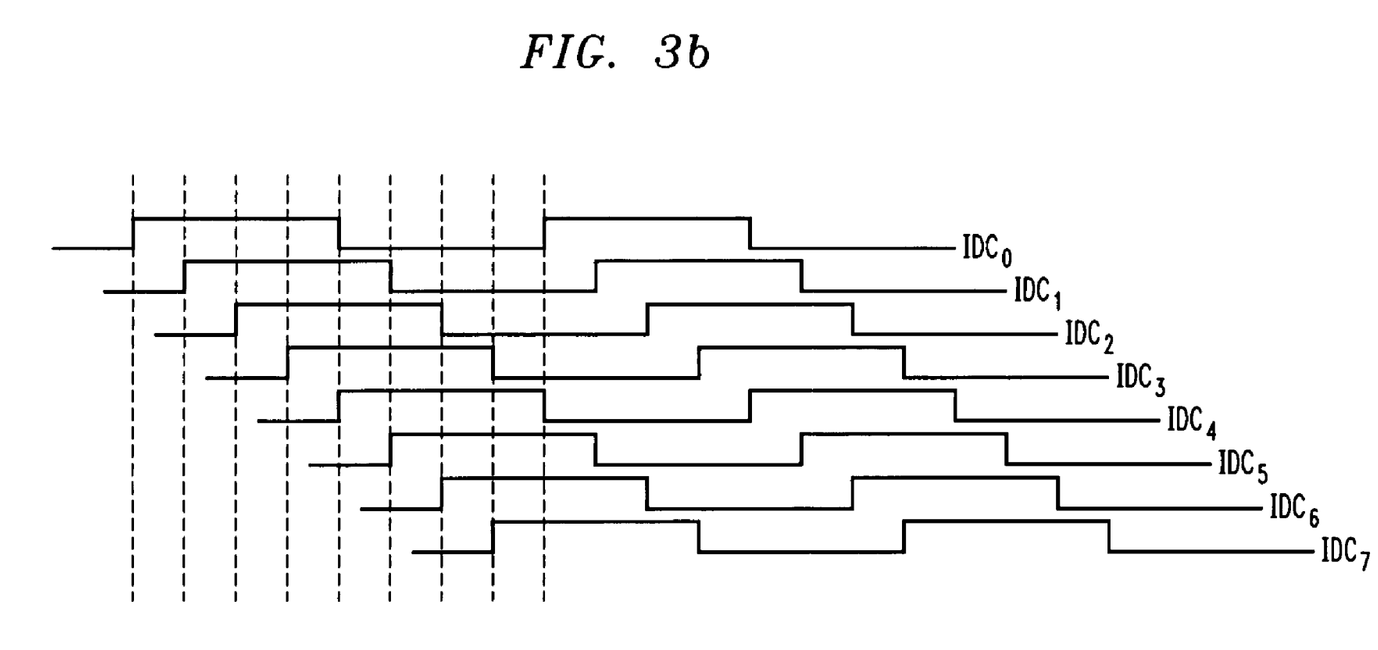

The outputs of the delay cells 42 collectively serve as the outputs of the DCO 28, i.e., output lines $IDC_0$, $IDC_1$, $IDC_2, \ldots, IDC_m$. The outputs of the multi-phase ring oscillator configuration shown in FIG. 3a are separated from adjacent outputs by a phase difference of 180° divided by the number of ring oscillators, e.g., 180/m for m delay cells. Such an example of output signals from the outputs $IDC_0$, $IDC_1$, $IDC_2, \ldots, IDC_m$ is shown in FIG. 3b. It should be understood that the multi-phase ring oscillator may include other components, including other inverters, that are not shown in FIG. 3a.

The m outputs from the DCO are input to m frequency dividers, e.g., as shown in FIG. 2. As discussed previously herein, the frequency dividers 29 divide the frequency of the respective DCO output by N, where N is greater than or equal to 2. The outputs of the frequency dividers 29 are coupled or input to the phase detector 22 as the sampler inputs $Ck_0$, $Ck_1$, $Ck_2, \ldots, Ck_m$.

Figure 4A:
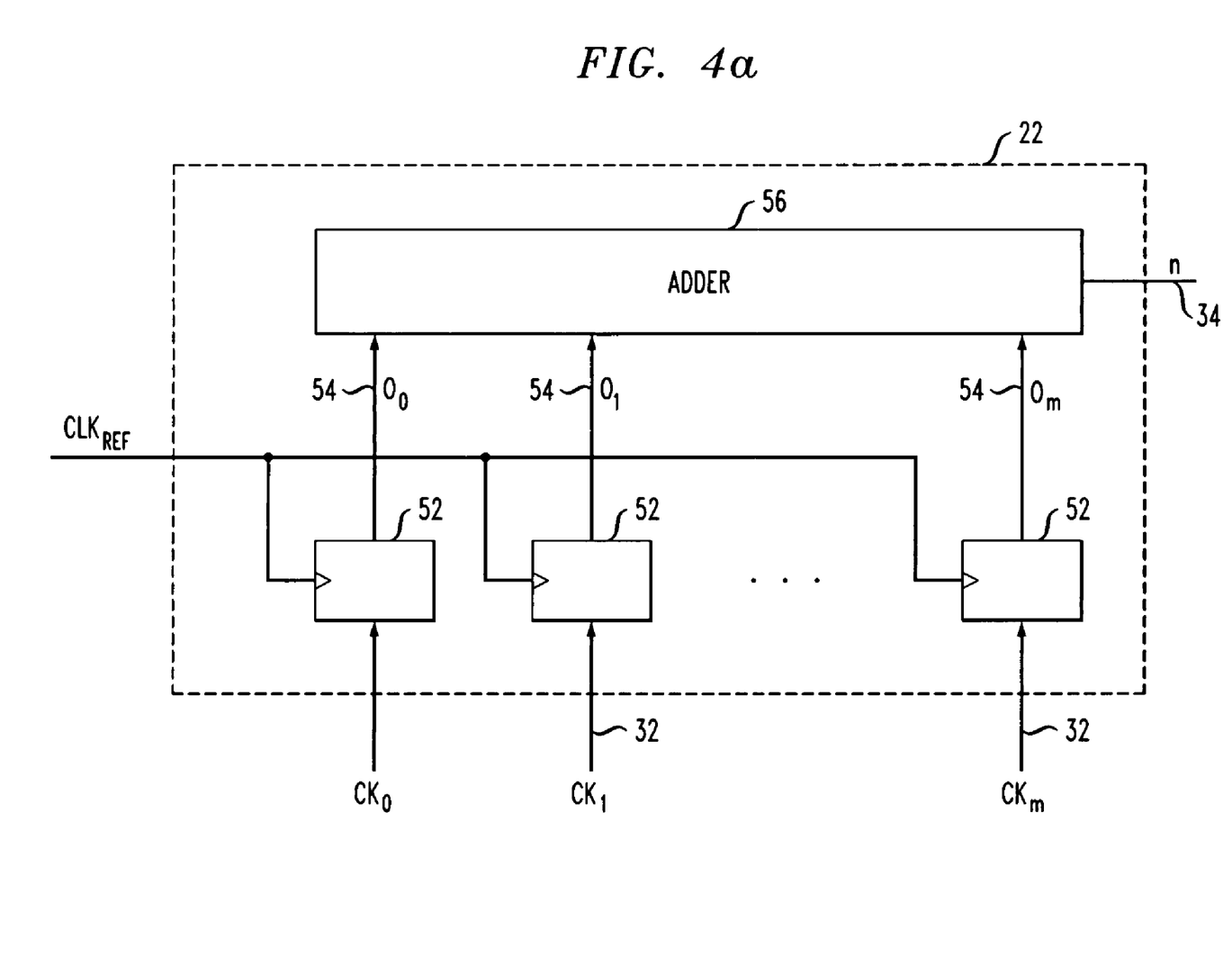
FIG. 4a is a simplified schematic diagram of the phase detector in the phase-locked loop of FIG. 2.

Referring now to FIG. 4a, shown is a simplified schematic diagram of the phase detector 22 in the PLL 20 of FIG. 2. The phase detector 22 includes a plurality of devices 52 suitable for clocking in data from the plurality of sampler inputs 32. For example, the devices 52 are a corresponding plurality of flip-flops. Also, the reference clock signal, $CLK_{REF}$, is connected to the devices 52 for clocking in data from the inputs 32 to their respective device 52. Each device 52 has an output line 54, e.g., $O_0, O_1, O_2, \ldots, O_m$, that inputs to an adder 56. The devices 52 output a logical low or "0" or a logical high, or "1" to the adder 56 on the output lines 54. The output line of the adder 56 is the output line 34 of the phase detector 22.

Typically, the phase detector 22 is configured in such a way that the total number of devices 52 is an odd number, as will be discussed in greater detail hereinbelow. However, in configurations in which the phase detector 22 has an even number of sampler inputs 32, i.e., when m is an even number, a delayed version of $CK_m$ is added to make the total number of devices 52 odd. Also, it should be understood that the phase detector 22 and the loop filter 26 operate in the reference clock ($CLK_{REF}$) domain, which generally is much lower in frequency than the outputs from the DCO 28 ($IDC_0$-$IDC_m$).

Figure 4B:
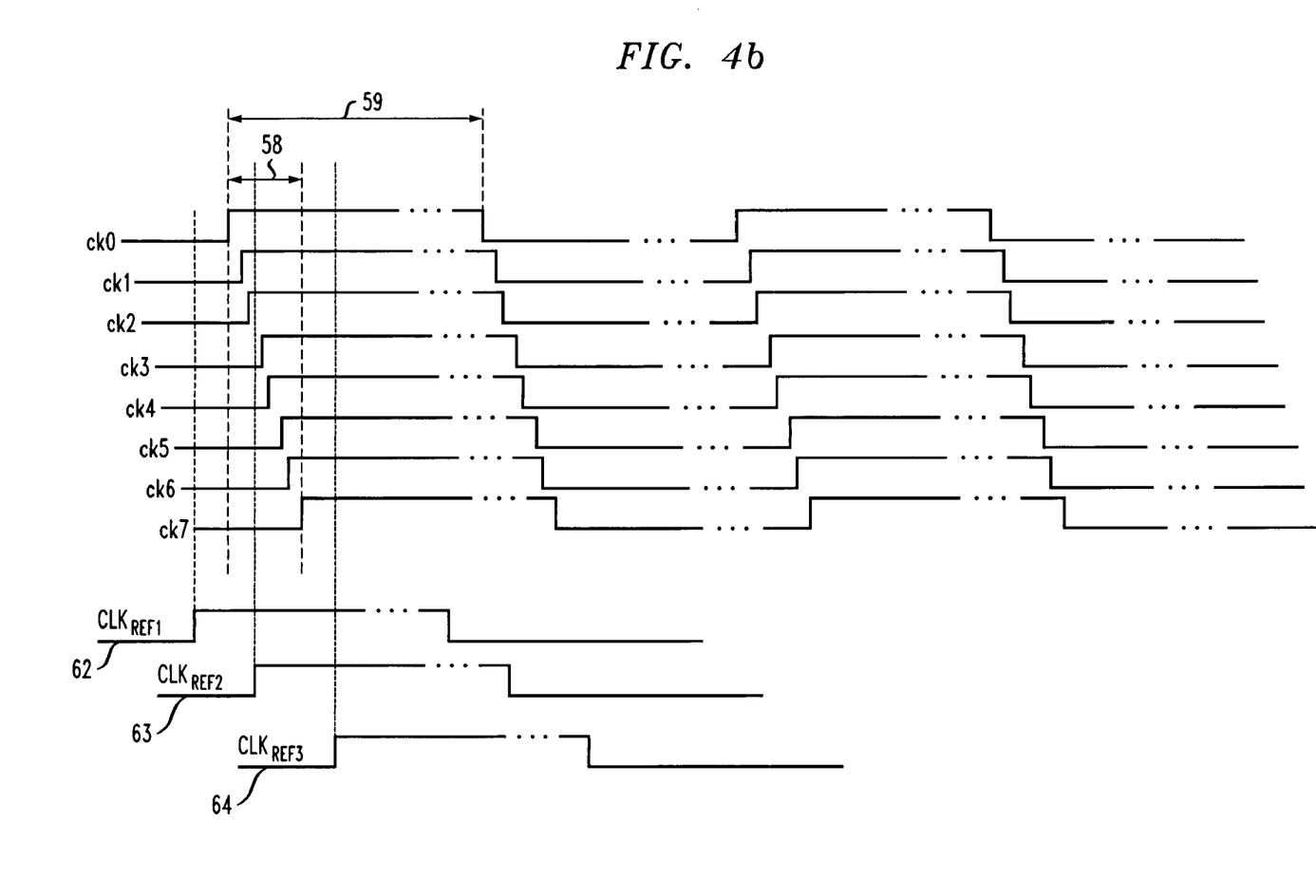

The plurality of sampler inputs 32 collectively input a plurality of data bits, e.g., m data bits, to the phase detector 22 from the output of the frequency dividers 29. As shown in FIG. 4b, depending on the phase relationship between the reference clock signal, $CLK_{REF}$, and the sampler inputs $Ck_0$, $Ck_1$, $Ck_2, \ldots, Ck_m$, the outputs of devices 52, i.e., $O_0, O_1, O_2, \ldots, O_m$, can be anywhere from all zeros to all zeros.

For example, given the sampler inputs $Ck_0, Ck_1, Ck_2, \ldots, Ck_m$ shown in FIG. 4b, one DCO output clock period is shown generally as 58, i.e., from the initial data state transition of $Ck_0$ to the data state transition of $Ck_7$. Similarly, one period for the reference clock signal, $CLK_{REF}$, is shown generally as 59, i.e., from the leading edge of the data state transition of $CK_0$ (or any other sampler input) to the trailing edge of the same data state transition.

If the phase of the reference clock signal is leading all of the sampler inputs $Ck_0, Ck_1, Ck_2, \ldots, Ck_m$, e.g., $CLK_{REF1}$, which is shown generally as 62, it can be seen that the none of the data state transitions of the sampler inputs $Ck_0$, $Ck_1$, $Ck_2, \ldots, Ck_m$ will be clocked in to their respective device 52. Therefore, all of the output lines 54, e.g., $O_0, O_1, O_2, \ldots, O_m$, to the adder 56 will have a logical low or "0" value. If the phase of the reference clock signal is as shown as 63, e.g., $CLK_{REF2}$, it can be seen that the first three data state transitions of the sampler inputs $Ck_0, Ck_1, Ck_2, \ldots, Ck_m$ (i.e., $Ck_0$, $Ck_1, Ck_2$) will be clocked in to their respective device 52. Thus, in such example, the first three output lines 54 to the adder 56 will have a logical high or "1" value and the remaining output lines will have a logical low or "0" value. Similarly, If the phase of the reference clock signal is as shown as 64, e.g., $CLK_{REF3}$, it can be seen that all of the data state transitions of the sampler inputs $Ck_0, Ck_1, Ck_2, \ldots, Ck_m$ will be clocked in to their respective device 52. Thus, in such example, all of the output lines 54, e.g., $O_0, O_1, O_2, \ldots, O_m$, to the adder 56 will have a logical high or "1" value.

The adder 56 is configured with suitable circuitry to convert the data bits received from output lines 54 into an n-bit binary or binary-coded word, using any suitable code conversion format, such as thermal meter encoding or 2's compliment encoding. For example, assume that the sampler input $Ck_i$ is to be aligned to the reference clock $CLK_{REF}$, where i is (m+1)/2 and can be any number from 0 to m. In a case where m=7, the sampler input to be aligned to the reference clock $CLK_{REF}$ is $Ck_4$.

The adder 56 counts the number of "0"s and "1"s from the lines 54 and outputs the difference on output line 34. For example, if the adder 56 has seven total inputs (i.e., $O_0$ to $O_6$), the adder 56 would output a 1 (i.e., 4-3). Since the output is a positive number, it means that the reference clock $CLK_{REF}$ lags $Ck_i$. If there are more "0"s than "1"s, the output of the adder 56 is a negative number, which means that the reference clock $CLK_{REF}$ leads $Ck_i$.

Figure 5:
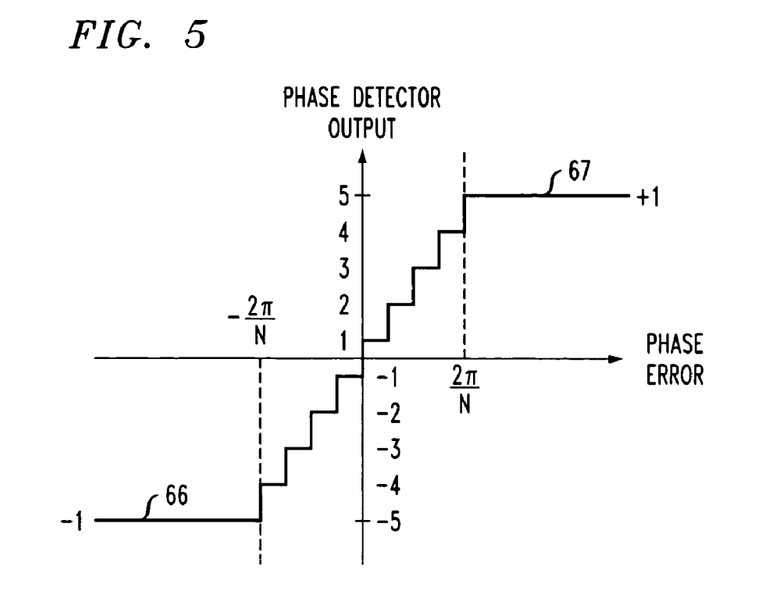
FIG. 5 is a simplified graphic diagram of the relationship between the output of the phase detector and the phase error between the inputs to the phase detector.

Referring now to FIG. 5, shown is a graph of the relationship between the output of the phase detector 22 (y axis) and the phase error (x axis) between the inputs to the phase detector 22. The phase error is the difference in phase between the reference clock, $CLK_{REF}$, and the clock phases of the sampler inputs 32, $Ck_0, Ck_1, Ck_2, \ldots, Ck_m$, output from the frequency dividers 29. The variable N is the ratio of the frequency of the reference clock, $CLK_{REF}$, to the current operating frequency of the DCO 28.

As shown in FIG. 5, when the output of the DCO 28 and the reference clock, $CLK_{REF}$, are completely out of phase, the output of the phase detector 24 will have either a maximum negative binary or binary-encoded value (e.g., −A, where A is the value of an n-bit binary word), shown generally as 66, or a maximum positive binary or binary-encoded value (e.g., +A), shown generally as 67, depending on which phase is leading and which phase is trailing. As an odd number of the data clocking devices 52 are used, when the PLL 20 is locked, the phase detector 22 is alternating between +1 and −1. However, the average output is zero.

Figure 6:
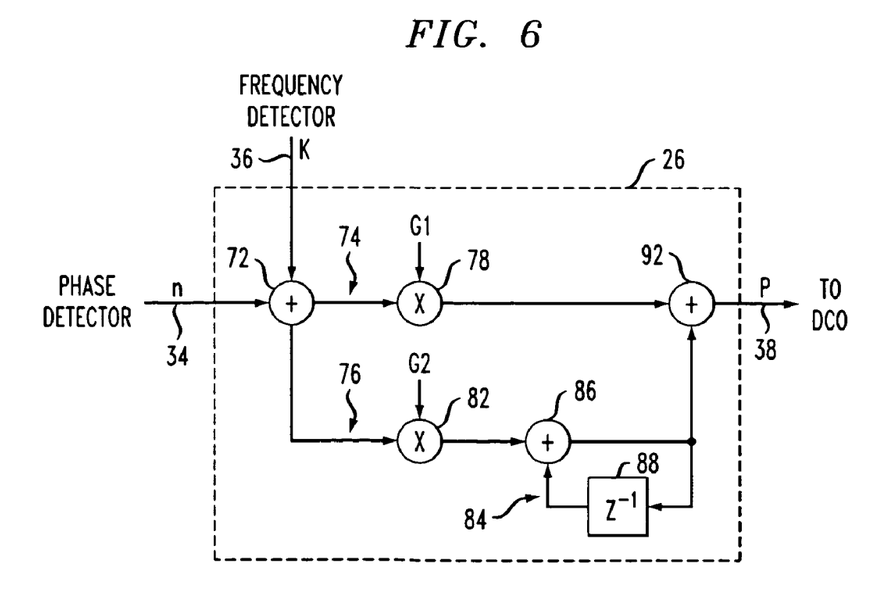
FIG. 6 is a simplified schematic diagram of the loop filter in the phase-locked loop of FIG. 2.

Referring now to FIG. 6, shown is a simplified schematic diagram of the loop filter 26. As discussed hereinabove, the output line 34 from the phase detector 22 is coupled to the first input of the loop filter 26 and inputs an n-bit control word thereto. Also, the output line 36 from the frequency detector 24 is coupled to the second input of the loop filter 26 and inputs a k-bit control word thereto. The first and second inputs of the loop filter 26 are coupled to a first summing node 72, wherein the n-bit control word from the phase detector 22 and the k-bit control word from the frequency detector 24 are added.

The output of the first summing node 72 is coupled to a first or proportional loop filter path (shown generally as 74) and a second or integral loop filter path (shown generally as 76).

The first or proportional loop filter path 74 includes a first loop gain control 78, which is controlled externally, as indicated generally by G1. The second or integral loop filter path 76 includes a second loop gain control 82 and an integrator 84 that comprises an adder 86 and a register (unit delay) 88 coupled as shown. The gain of the second loop gain control 82 is controlled externally, as indicated generally by G2. The first and second paths are coupled to a second summing node 92. The output of the second summing node 92 is the output line 38 of the loop filter 26. As discussed hereinabove, the output line 38 of the loop filter 26 couples to the input of the DCO 28 and inputs a p-bit control word to the DCO 28.

Referring again to FIG. 2, with continuing reference to FIG. 6, the frequency detector 24 has a first input coupled to the input signal or reference clock signal, $CLK_{REF}$, of the PLL 20, and a second input coupled to the output line 39 of the DCO 28. The frequency detector 24 also has the output line 36 that inputs to the second input of the loop filter 26. In the PLL 20, the frequency detector 24 is used to set or calibrate the DCO 28 (via the loop filter 26) to the desired operating frequency. The desired operating frequency is N times the reference clock, $CLK_{REF}$, where N is the ratio between the reference clock and the desired operating frequency.

The frequency detector 24 can include a counter or other suitable component, group of components or circuitry that measures the frequency of the DCO 28. The frequency detector 24 determines a frequency error, which is the frequency difference between the desired oscillating frequency of the DCO 28 and the immediate or present operating frequency of the DCO 28. The frequency detector 24 generates a k-bit binary or binary-coded control word, which is representative of the frequency error, i.e., the frequency difference between the desired oscillating frequency of the DCO 28 and the operating frequency of the DCO 28. As discussed hereinabove, the frequency detector 24 outputs the k-bit control word to the second input of the loop filter 26.

As part of the overall operation of the PLL 20, the phase detector 22 compares the phase of the sampler inputs 32 $Ck_0$, $Ck_1$, $Ck_2$, ..., $Ck_m$ to the reference clock signal, $CLK_{REF}$, and generates an n-bit control word representative of the phase differences therebetween, i.e., the phase error. As discussed, the sampler inputs 32 are received from the output of the DCO 28. The frequency detector 24 compares the operating frequency of the DCO 28 with the target frequency and generates a k-bit control word representative of the frequency difference, i.e., the frequency error.

The loop filter 26 combines the n-bit phase error control word generated from the phase detector 22 and the k-bit frequency error control word generated from the frequency detector and generates a p-bit control word to control the operation of the DCO 28. The p-bit control word from the loop filter 26 controls or adjusts the operating phase and frequency of the DCO 28 in an appropriate manner. For example, in some arrangements, the DCO 28 is configured with a plurality of current sources connected in parallel, and the output of the DCO 28 depends on the amount of current flowing through the DCO 28. In such arrangements, the loop filter 26 is coupled to the DCO 28 in such a way that the individual bits of the p-bit control word cause individual switches to switch corresponding current sources into or out of the overall circuit of the DCO 28, thus varying the current flow through the DCO 28.

Based on the p-bit control word provided to the DCO 28, the operating phase and frequency of the DCO 28 are adjusted accordingly. Once adjusted, the multi-phase output of the DCO 28 is fed back via the frequency dividers 29 to the phase detector 22, as the sampler inputs 32 for subsequent phase error determinations. Similarly, the output of the DCO 28 is fed back to the frequency detector 24 for subsequent frequency error determinations.

This digital comparison and adjustment process continues until the PLL 20 becomes locked. Then, the digital comparison and adjustment process continues in the manner described to keep the operating phase and frequency of the DCO 28 the same as that of the reference clock signal, $CLK_{REF}$.

According to embodiments of the invention, the digital PLL as described hereinabove requires a relatively small chip areas compared to conventional analog PLLs. Also, compared to conventional digital PLLs, the PLL according to embodiments of the invention employs a new and novel phase detector and has a relatively less complex configuration. Also, the PLL according to embodiments of the invention is less process dependent and has the capability of operating with a relatively low supply voltage. Finally, the operating performance of the PLL according to embodiments of the invention is more robust against environmental noise than conventional PLLs.

It will be apparent to those skilled in the art that many changes and substitutions can be made to the embodiments of the invention herein described without departing from the spirit and scope of the invention as defined by the appended claims and their full scope of equivalents. For example, although the circuit components are described hereinabove as an integrated circuit or part of an integrated circuit, the various circuit components alternatively can be discrete components arranged and coupled together to form the various circuits shown and described.

The invention claimed is:

1. An integrated circuit including a digital phase-locked loop (PLL) circuit, comprising:
   a digital phase detector having a phase detector output and configured to generate a first multi-bit output via the phase detector output, the first multi-bit output representing a phase difference between a reference clock signal and a plurality of clock phase inputs;
   a digital frequency detector having a frequency detector output and configured to generate a second multi-bit output via the frequency detector output, the second multi-bit output representing a frequency difference between the reference clock signal and a current operating frequency of a digitally-controlled oscillator (DCO);
   a digital loop filter coupled to the digital phase detector via the phase detector output and coupled to the digital frequency detector via the frequency detector output, the loop filter having a loop filter output and generating a third multi-bit output via the loop filter output, the third multi-bit output being based on the first multi-bit output from the digital phase detector and the second multi-bit output from the digital frequency detector; and
   the digitally-controlled oscillator (DCO) coupled to the digital loop filter via the loop filter output, the digital phase detector and the digital frequency detector, wherein the third multi-bit output from the digital loop filter is input to the DCO as a multi-bit control word, wherein the DCO has a first feedback path coupled to the digital phase detector and a second feedback path coupled to the digital frequency detector, wherein the DCO outputs the plurality of clock phase inputs to the digital phase detector via the first feedback path based on the multi-bit control word, and wherein the DCO provides the current operating frequency of the DCO to the digital frequency detector via the second feedback path based on the multi-bit control word.

2. The integrated circuit as recited in claim 1, wherein the digital phase detector futher comprises:
- a plurality of data clocking devices coupled to the reference clock signal and coupled to the plurality of clock phase inputs, the plurality of data clocking devices corresponding to the plurality of clock phase inputs; and
- an adder coupled to the plurality of data clocking devices, wherein the adder is configured to generated the first multi-bit output based on the phase differences between the reference clock signal and the plurality of clock phase inputs.

3. The integrated circuit as recited in claim 2, wherein at least one of the plurality of data clocking devices comprises a flip-flop.

4. The integrated circuit as recited in claim 1, wherein the phase detector is configured to sample the plurality of clock phase inputs using the reference clock signal.

5. The integrated circuit as recited in claim 1, wherein the DCO has an operating frequency, wherein the digital frequency detector determines the operating frequency of the DCO via the second feedback path, and wherein the digital frequency detector is configured to generate the second multi-bit output based on the difference between the frequency of a desired multiple of the reference clock signal and the operating frequency of the DCO.

6. The integrated circuit as recited in claim 1, further comprising a plurality of frequency dividers coupled along the first feedback path between the DCO and the digital phase detector, wherein the number of frequency dividers corresponds to the plurality of clock phase inputs and wherein the frequency dividers divide down the frequency of the clock phase inputs by a divisor N.

7. The integrated circuit as recited in claim 1, wherein at least one of the first multi-bit output, the second multi-bit output and the third multi-bit output further comprises a binary-coded control word.

8. The integrated circuit as recited in claim 1, wherein the DCO further comprises a multi-phase ring oscillator.

9. The integrated circuit as recited in claim 1, wherein the digital loop filter includes a first proportional loop filter path and a second integral loop filter path.

10. A method for phase locking a digitally-controlled oscillator (DCO) to a reference clock, comprising the steps of:
- generating with a digital phase detector having a phase detector output a first multi-bit control word via the digital phase detector output, the first multi-bit control word representing a phase difference between a reference clock signal and a plurality of clock phase inputs;
- generating with a digital frequency detector having a frequency detector output a second multi-bit control word via the frequency detector output, the second multi-bit control word representing a frequency difference between the reference clock signal and a current operating frequency of the DCO;
- generating with a digital loop filter coupled to the phase detector output and coupled to the frequency detector output a third multi-bit control word via a loop filter output, the third multi-bit control word representing a summation of the first multi-bit control word and the second multi-bit control word, the third multi-bit control word representing an operating control word for the digitally-controlled oscillator;
- providing by the digitally-controlled oscillator the plurality of clock phase inputs to the digital phase detector via a first feedback path, based on the third multi-bit control word; and providing by the digitally-controlled oscillator the current operating frequency of the DCO to the digital frequency detector via a second feedback path, based on the third multi-bit control word.

* * * * *

UNITED STATES PATENT AND TRADEMARK OFFICE
CERTIFICATE OF CORRECTION

PATENT NO. : 7,577,225 B2 Page 1 of 1
APPLICATION NO. : 11/191895
DATED : August 18, 2009
INVENTOR(S) : Azadet et al.

It is certified that error appears in the above-identified patent and that said Letters Patent is hereby corrected as shown below:

Column 1, line 1, delete "PHASE-LOOKED" and insert --PHASE-LOCKED--.

Signed and Sealed this

Twenty-fifth Day of May, 2010

David J. Kappos
*Director of the United States Patent and Trademark Office*

UNITED STATES PATENT AND TRADEMARK OFFICE
CERTIFICATE OF CORRECTION

PATENT NO. : 7,577,225 B2  Page 1 of 1
APPLICATION NO. : 11/191895
DATED : August 18, 2009
INVENTOR(S) : Azadet et al.

It is certified that error appears in the above-identified patent and that said Letters Patent is hereby corrected as shown below:

Title Page, Item (54) and at Column 1, line 1, title, delete "PHASE-LOOKED" and insert --PHASE-LOCKED--.

This certificate supersedes the Certificate of Correction issued May 25, 2010.

Signed and Sealed this

Twenty-second Day of June, 2010

David J. Kappos
*Director of the United States Patent and Trademark Office*